United States Patent [19]
Yoshitake et al.

[11] Patent Number: 4,781,980
[45] Date of Patent: Nov. 1, 1988

[54] COPPER POWDER FOR USE IN CONDUCTIVE PASTE

[75] Inventors: Masayoshi Yoshitake, Ohtsu; Shigeru Kito, Kyoto; Jiro Yamamoto, Kasatsu, all of Japan

[73] Assignee: Fukuda Metal Foil & Powder Co., Ltd., Kyoto, Japan

[21] Appl. No.: 29,232

[22] Filed: Mar. 23, 1987

[30] Foreign Application Priority Data

Mar. 28, 1986 [JP] Japan .................................. 61-69898

[51] Int. Cl.$^4$ .......................... B32B 5/16; H01B 1/06; C22B 15/00
[52] U.S. Cl. .................. 428/403; 427/126.1; 427/217; 427/220; 252/512; 252/518; 252/520; 75/117; 75/244; 75/247; 75/0.5 A
[58] Field of Search ...................... 252/512, 520, 518; 428/403, 407; 427/126.1, 216, 217, 220, 221; 75/117, 230, 244, 247, 0.5 A

[56] References Cited

U.S. PATENT DOCUMENTS 4,094,853 6/1978 Monte ................................. 523/202
4,305,847 12/1981 Stoetzier .......................... 106/1.13
4,529,555 7/1985 Matsushita ........................ 556/174
4,680,140 7/1987 Kageyama .......................... 252/512

FOREIGN PATENT DOCUMENTS 6058268 12/1985 Japan .

Primary Examiner—Josephine Barr
Attorney, Agent, or Firm—Wegner & Bretschneider

[57] ABSTRACT

The present invention provides a copper powder for use in a conductive paste which allows the paste to possess excellent initial electrical conductivity, thermal resistance, and humidity resistance, and which enables the paste to maintain stable electrical conductivity for a long period of time. The copper powder of the present invention comprises a raw material copper powder; an anti-oxidization film comprising an organic acid salt of a higher aliphatic amine which is formed on the surface of the copper powder; and a surface film which comprises 0.2 to 10 parts by weight of a dispersing agent of a boron-nitrogen composite type and 0.1 to 10 parts by weight of at least one coupling agent of the group consisting of isopropyl-triisostearoyl-titanate and aceoalkoxy-aluminum-diisopropylate, relative to 100 parts by weight of the copper powder, and which is formed on the anti-oxidization film.

6 Claims, No Drawings

COPPER POWDER FOR USE IN CONDUCTIVE PASTE

BACKGROUND OF THE INVENTION (1) Field of the Invention

The present invention relates to a copper powder for use in a conductive paste which allows the paste to possess excellent initial electrical conductivity, thermal resistance, and humidity resistance, and which enables the paste to maintain stable electrical conductivity for a long period of time.

(2) Description of Prior Art

In general, the electrical conductivity of a copper powder tends to drop because the surface of the copper powder is oxidized. Therefore, in order to obtain a copper powder with an adequate degree of conductivity when it is mixed with a synthetic resin, various proposals have been made with respect to methods of surface treating the copper powder or methods which employ additives.

An example of a method of surface treating a copper powder is one which employs a protective layer made of benzotriazole, tryltriazole, chromate, or silicate. Although it can be appreciated that such a protective layer has the effect of preventing discoloration, the layer greatly impairs conductivity and is thus unsuitable for a use in which electrical conductivity is aimed for. U.S. Pat. No. 4,305,847 discloses a method of adding an organic titanic compound to a conductive coating or paste.

However, such a method of adding various additives gives no consideration to the oxidized layer on the surface of a copper powder, which will greatly affect the level of conductivity of the coating. As a result, even when a large amount of copper powder is blended, the method fails to achieve a certain level of conductivity which has a specific resistance of $10^{-4}$ $\Omega$.cm approximately equal to those of silver conductive coatings.

In addition, since the method provides no anti-oxidization treatment of the copper powder, the surface of the copper powder is oxidized and the conductivity is degraded within a short period when the resulting coating film is subjected to environmental reliability tests. Thus, this coating shows low reliability.

In view of advances being made in the development of printed circuits there is a demand for a copper powder which may be used in a conductive paste applicable to printed circuits. Such a copper powder should possess a sufficient degree of thermal resistance to withstand the high temperature at which the resin used in the paste is cured and also the high temperature during soldering process. However, no such copper powder has yet been found.

SUMMARY OF THE INVENTION

In order to obtain a conductive paste which exhibits excellent conductivity, it is first necessary for the copper powder used in the paste to have only a small amount of surface oxidized layer.

It is possible to obtain a copper powder with a small amount of oxidized layer by a known method such as one that comprises dissolving a surface oxidized layer with an acid such as hydrochloric acid. With this method, however, an oxidized layer may again be formed during drying. Thus, it is difficult in industrial terms to manufacture a copper powder with a small amount of oxidized layer. In addition, even if a copper powder with a small amount of oxidized layer can be obtained, the copper powder would be effected by oxygen and humidity in the air, and an oxidized layer would again be formed within a short period. In particular, when the copper powder is a fine powder such as one that can be used in a conductive paste applicable to circuits manufactured by screen printing, an oxidized layer will be formed very rapidly on the surface of the fine copper powder exposed to the air and the oxidized layer will be formed in a large amount. Accordingly, when thus obtained copper powder having a large amount of the oxidized layer is mixed with resin to obtain a conductive paste, the resulting coating impairs conductivity. It is, therefore, necessary to provide a protective layer on particularly fine copper powder in order to prevent increasing the amount of the oxidized layer.

Secondly, in order to obtain a conductive coating with excellent conductivity, it is necessary to ensure that no variation in the conductivity of the coating is caused to such an extent that the variation would cause problems during use, even if a small amount of thin oxidized layer is formed on the surface of the copper powder which is added to the coating. In brief, it is difficult to completely remove all oxidized layers from a copper powder, and hence a copper powder generally has a certain amount of oxidized layer. In addition, it has been conventionally recognized from the results of environmental reliability tests covering a long time period that the copper powder in a coating is gradually oxidized, and, therefore, the conductivity of the coating tends to be deteriorated.

Therefore, in order to prevent the conductivity of a coating from varying from its initial level, and to maintain the coating with a stable degree of conductivity for a long period of time, it is required to ensure that even when a thin oxidized layer is formed on the surface of the copper powder and the conductivity of the coating is varied by the oxidized layer, the variation of the conductivity is not so big as to make trouble in the practical use of the coating.

In addition, the copper powder to be used in a conductive paste applicable to printed circuits has to be one which possesses a sufficient degree of thermal resistance to withstand the temperature at which the resin used in the paste is cured and the temperatures at which baking and soldering are conducted.

Further, in order to faciliate the manufacture of a conductive paste in which the copper powder is mixed with a synthetic resin, or to faciliate adhesion of the copper powder to the resin, it is necessary to ensure that there is good affinity between the copper powder and the synthetic resin.

It is, therefore, a primary object of the present invention to provide a copper powder for use in a conductive paste which has an anti-oxidation film that does not adversely affect the conductivity of the paste.

Another object of the present invention is to provide a copper powder which is capable of maintaining stable conductivity for a long period of time.

Another object of the present invention is to provide a copper powder which possesses a good affinity for synthetic resin.

Another object of the present invention is to provide a copper powder which possesses a high degree of thermal resistance.

These and other objects of the present invention will be clear from the following description.

In accordance with the present invention, there is provided a copper powder for use in a conductive paste, which comprises a raw material copper powder; an anti-oxidation film comprising an organic acid salt of a higher aliphatic amine which is formed on the surface of the copper powder; and a surface film which comprises 0.2 to 10 parts by weight of a dispersing agent of a boron-nitrogen composite type and 0.1 to 10 parts by weight of at least one coupling agent of the group consisting of isopropyl-triisostearoyl-titanate and acetoalkoxy-aluminum-diisopropylate, relative to 100 parts by weight of the copper powder and which is formed on the anti-oxidization film.

DESCRIPTION OF THE PREFERRED EMBODIMENTS

The method of preparing the raw material copper powder as the base material for the processed copper powder according to the present invention is not specifically limited, and any raw material copper powder prepared by a mechanical pulverization method, an electrolytic method, or an aqueous solution reduction method and which is a fine copper powder having a mean particle size of not more than 50 μm may be used. Preferably, the copper powder should have a mean particle size of not more than 10 μm.

The organic acid salt of a higher aliphatic amine usable in the present invention is a salt formed by an aliphatic mono- or di-amine having aliphatic hydrocarbon having 12 to 22 carbon atoms, and by a mono- or di-carboxylic acid having either aliphatic hydrocarbon having 2 to 23 carbon atoms or aromatic hydrocarbon groups having 7 to 8 carbon atoms. Specific examples of the organic acid salt of a higher aliphatic amine are palm mono-amine acetate, palm mono-amine salicylate, palm di-amine adipate, and beef tallow di-amine salicylate.

In order to form the anti-oxidization film of the organic acid salt of a higher aliphatic amine on the surface of the copper powder, a method may be used which comprises coating the organic acid salt on the surface of the copper powder either singularly or after the organic acid salt has been dissolved in and mixed with an organic solvent. However, it is advantageous to use an aqueous solution of the organic acid salt of a higher aliphatic amine because this will enable uniform coating and an increase in the level of conductivity. In this connection, it is preferable to use an aqueous solution containing 0.005 to 1% by weight of the organic acid salt. Although it is not clearly known why the use of such an aqueous solution form provides an increase in conductivity, it is conjectured that this is because an oxidized layer on the surface of the copper powder is removed by the washing action of the amine or the organic acid.

A method which makes use of such an aqueous solution form of the organic acid salt of a higher aliphatic amine may comprise dissolving an organic acid salt of a higher aliphatic amine in water, and bringing the thus prepared aqueous solution into contact with the copper powder. If the acid salt is not readily soluble in water, it may be dissolved in water with the aid of a small amount of alcohol.

Specific examples of methods of bringing such an aqueous solution into contact with the copper powder are the method comprising spraying the aqueous solution onto the copper powder, the method comprising placing the copper powder on a filter fabric and dipping the thus placed copper powder into the aqueous solution, and the method comprising agitating the copper powder in the aqueous solution. If an aqueous solution of the organic acid salt is used while the copper powder is being prepared by an electrolytic or reduction method in which copper powder is deposited in an aqueous solution, this will facilitate obtaining copper powder having an anti-oxidation film of the organic acid salt but having a small amount of oxidized layer, thus being advantageous in industrial terms.

The thus treated copper powder is then separated from water, and by drying, a uniform and very thin anti-oxidation film is formed on the surface of the copper powder.

The amount of the organic acid salt of a higher aliphatic amine relative to the copper powder is not specifically limited because this amount varies in accordance with the method of treating with the organic acid salt, the quantity of the aqueous solution, and the time period of the treatment. However, if an aqueous solution form of the organic acid salt is used, it is advantageous in industrial terms to use between 0.005 and 10, preferably between 0.005 and 1 parts by weight of the organic acid salt of a higher aliphatic amine relative to 100 parts by weight of the copper powder.

In the present invention, a surface film comprising a specific amount of a dispersing agent of a boron-nitrogen composite type and a specific amount of at least one coupling agent the group consisting of isopropyl-triiostearoyl-titanate and acetoalkoxy-aluminum-diisopropylate is then formed on the anti-oxidation film.

The boron-nitrogen composite type dispersing agent usable in the present invention is a dispersing agent in which a boron-containing surfactant substance and a nitrogen-containing surfactant substance are blended and combined with each other. The boron-containing surfactant substance has in the molecule thereof a boronic acid ester bond with polyhydric alcohol, and has one or more groups of hydrocarbons having 7 to 25 carbon atoms. The nitrogen-containing surfactant substance has one or more groups of hydrocarbons having 7 to 25 carbon atoms, and has non-covalent electron pairs. Examples of the dispersing agent includes a bis-1,2,3-trihydroxypropaneborite.8-heptadecane-1-carboxylate.N-polyoxyethylene-1-aminohexadecane compound; a polyoxyethylene-bis-1,2,3-trihydroxypropaneborite.8-heptadecane-1-carboxylate.N-polyoxyethylene-1-aminohexadecane compound; a bis-1,2,3-trihydroxypropaneborite.1-isoheptylisodecane-1-carboxylate.N-polyoxyethylene-1-aminohexadecane compound; a bis-1,2,3-trihydroxypropaneborite.octadecane-1,2-dicarboxylate.N-polyoxyethylene-1-aminohexadecane compound; and a bis-1,2,3-trihydroxypropaneborite.octadecane-1,2-dicarboxylate.2,2',2"-nitrilotriethanol compound.

The amount of the boron-nitrogen composite type dispersing agent relative to 100 parts by weight of the copper powder should be 0.2 to 10 parts by weight. If the amount is less than 0.2 parts by weight, the effect of thermal resistance is not provided to a satisfactory degree, while if the amount exceeds 10 parts by weight, such properties of the resulting coating film as adhesion and strength will be adversely affected. The preferable amount is 0.5 to 5 parts by weight relative to 100 parts by weight of the copper powder.

On the other hand, at least one coupling agent of the group consisting of isopropyl-triisostearoyl-titanate and acetoalkoxy-aluminum-diisopropylate is used in an amount of 0.1 to 10 parts by weight relative to 100 parts by weight of the copper powder in order to provide a copper powder for use in a conductive paste of the present invention with an enhanced affinity for synthetic resins.

If the above amount is less than 0.1 parts by weight, the desired effect is not performed to a satisfactory degree, while if the amount exceeds 10 parts by weight, the properties of the resulting coating film may be adversely affected. The preferable amount is 0.2 to 5 parts by weight relative to 100 parts by weight of the copper powder.

The ratio of the dispersing agent to the above coupling agent is not limited, but it is preferable that the ratio be not less than 1:1.

The dispersing agent and the above coupling agent can be coated in a mixed form or in a separated form on the anti-oxidization film of the copper powder.

On the other hand, where they are used in the separated form, there can be employed the following methods. Namely, the boron-nitrogen composite type dispersing agent may be coated on the copper powder by mixing the two by means of a mixer or ball mill. In order to curtail the mixing period of time, the dispersing agent may be diluted by a compatible solvent such as toluene or isopropyl alcohol before mixing. What is important is that the copper powder is coated with the boron-nitrogen composite type dispersing agent, and the method of mixing is not specifically limited.

It is possible to add the boron-nitrogen composite type dispersing agent directly to the paste. Such a method, however, is not advisable because it causes a reduction in the dispersing agent's ability to stabilize the conductivity, and also because if the same level of this ability is aimed at, three to five times the amount of dispersing agent has to be added.

Isopropyl-triisostearoyl-titanate and/or acetoalkoxy-aluminum-diisopropylate may be coated onto the copper powder by the same method of mixing the boron-nitrogen composite type dispersing agent with the copper powder, either simultaneously with the mixing of this dispersing agent or separately therefrom.

Although it is possible to add at least one of these substances directly to the paste, it is much more effective to coat the same on the surface of the copper powder, with less amount of the substance(s), i.e. ⅓ to 1/10 of the same, being used in the latter case.

This is probably because, if the surface of the copper powder is modified by coating at least one coupling agent of the group consisting of isopropyl-triisostearoyl-titanate and acetoalkoxy-aluminum-diisopropylate on the surface of the copper powder before the copper powder is mixed with a synthetic resin, the surface can be modified effectively, thus allowing the copper powder to achieve an adequate affinity with synthetic resins, while using a smaller amount of these substance(s).

Coupling agents such as the other coupling agents of the titanate series, those of the aluminum series and those of the silane series are sold on the market as coupling agents for enhancing the affinity between synthetic resins and inorganic substances.

However, according to the findings of the inventors, coupling agents with structural formulas having S's or P's are not preferable because they cause discoloration or condensation of the copper powder. Isopropyl-triisostearoyl-titanate shows excellent performance as a surface modifier for the copper powder with respect to enhancing its affinity for the synthetic resin without causing any corrosion reaction.

None of the coupling agents of the aluminum series other than acetoalkoxy-aluminum-diisopropylate is preferable because, if such an agent were to be used to treat the surface of the copper powder, it might impair the humidity resistance of the copper powder.

Coupling agents of the silane series are not preferable because they cause a drop in the conductivity of the resulting copper powder.

It is not fully clear why the copper powder for use in a conductive paste in accordance with the present invention exhibits such excellent properties, nor to what kind of bond or interaction those excellent properties are attributable. However, the following is considered possible.

The organic acid salt of a higher aliphatic amine and the copper; perform chemisorption within a short period of time to form a thin film on the surface of the copper powder. This film acts to intercept any corrosive environment, thus producing the effect of preventing oxidation.

The boron-nitrogen composite type dispersing agent is considered to be a compound which performs charge transfer of the donor-acceptor type. That is, it is considered that the boron-nitrogen composite type dispersing agent has an electrical property which is similar to that of a semiconductor, and this electrical property acts to prevent any variation of the conductivity of the coating film that may cause problems during performance of the coating even if a thin oxidized layer is formed on the surface of the copper powder. It is also considered that the boron atoms in the boron-nitrogen composite type dispersing agent act to prevent oxidization of copper at higher temperatures, whereby conductivity is not impaired even when the coating film is used at a high temperature above 150° C.

The coupling agent of isopropyl-triisostearoyl-titanate and/or acetoalkoxy-aluminum-diisopropylate bonds with the surface of the copper powder, and thus acts to improve the wettability of the copper powder with respect to the synthetic resin. Therefore, it is considered that the coupling agent acts to enhance the printability of the conductive paste, and also to make the coating film dense, thus further enhancing the conductivity of the coating film.

If the organic acid salt of a higher aliphatic amine, the boron-nitrogen composite type dispersing agent, and at least one coupling agent of the group consisting of isopropyl-triisostearoyl-titanate and acetoalkoxy-aluminum-diisopropylate, all in accordance with the present invention, are used individually, the resulting copper powder for use in a conductive paste would not possess such excellent conductivity. It is, therefore, considered that the excellent properties displayed by the copper powder for use in a conductive paste are obtained by interactions between these compounds when they are used together.

EXAMPLES

The present invention will now be described with respect to some examples thereof. The scope of the present invention is not limited by these examples.

The terms "parts" appearing in the following description are all expressed in terms of weight.

EXAMPLE 1

100 parts of copper powder prepared by an electrolytic method and having a mean particle size of 10 μm were immersed in an aqueous solution of palm mono-amine acetate in which 0.005 part of palm mono-amine acetate had been dissolved in 100 parts of water, and the solution and the copper powder therein were agitated with a mixer for a period of 30 minutes. Subsequently, the copper powder was separated from the water, and then dried at a temperature of 100° C. for a period of 180 minutes. The thus dried copper powder has a hydrophobic anti-oxidization film formed thereon.

0.5 parts of a bis-1,2,3-trihydroxypropaneborite.8-heptadecane-1-carboxylate.N-polyoxyethylene-1-aminohexadecane compound and 0.2 part of isopropyl-triisostearoyl-titanate were added to 100 parts of the thus obtained copper powder having an anti-oxidization film, and the above substances were mixed with a mixer at a speed of 60 rpm and for a period of 30 minutes, thereby coating the respective compounds on the surface of the copper power. 100 parts of the thus obtained copper powder were then mixed with 20 parts of an acrylic resin and with 20 parts of butyl acetate. A conductive copper paste was manufactured by the method in which the viscosity of the conductive copper paste was adjusted by the butyl acetate until the viscosity became 300 poise while being measured by a B-type viscometer with a rotor No. 4 and at a speed of 12 rpm. The thus manufactured copper paste was printed on a sheet of Noryl resin with a screen of 150 mesh, thereby obtaining a coating film having a thickness of 20 μm, a line width of 2 mm, and a length of 150 mm, The results of the tests conducted with respect to the initial conductivity, thermal resistance, and humidity resistance are shown in Table 1 below.

Comparative Example 1 also shown in Table 1 shows the properties of a copper paste in which a raw material copper powder which is the same as that of Example 1 of the present invention was used without having been subjected to the surface treatment.

Comparative Example 2 shown in Table 1 shows the properties of a copper paste which was manufactured by treating the copper powder with the same aqueous solution of palm mono-amine acetate, but without subjecting the resulting copper powder to any following treatments.

Comparative Example 3 shown in Table 1 shows the properties of a copper paste formed from a copper powder which had been subjected to all the surface treatments except the treatment with isopropyl-triisostearoyl-titanate.

Comparative Example 4 shown in Table 1 shows the properties of a copper paste formed from a copper powder which had been subjected to all the surface treatments except the treatment with the boron-nitrogen composite type dispersing agent.

The thermal resistance tests were conducted at a temperature of 150° C. and for a period of 2 hours. The humidity resistance tests were conducted under the conditions of 65° C. and 95% RH for a period of 2000 hours. The conductivity values were each measured by using a double-bridge with the distance of 40 mm between the electrodes, and by calculating the specific resistance (Ω.cm) on the basis of the cross-sectional area of the coating film.

TABLE 1

| | Initial Conductivity (Ω · cm) | Conductivity after Thermal Resistance Test (Ω · cm) | Conductivity after Humidity Resistance Test (Ω · cm) |
|---|---|---|---|
| Example 1 of the Present Invention | $3 \times 10^{-4}$ | $4 \times 10^{-4}$ | $5 \times 10^{-4}$ |
| Comparative Example 1 | $10^{-2}$ | above $10^8$ | above $10^8$ |
| Comparative Example 2 | $5 \times 10^{-3}$ | $10^3$ | $10^{-1}$ |
| Comparative Example 3 | $5 \times 10^{-4}$ | $7 \times 10^{-4}$ | $5 \times 10^{-3}$ |
| Comparative Example 4 | $9 \times 10^{-4}$ | $10^{-1}$ | $10^{-3}$ |

As shown in the Comparative Examples in Table 1, when any one of the surface coating agents in accordance with the present invention was omitted from the copper powder, it did not show conductive characteristics which were as comprehensively excellent as those of Example 1 of the present invention.

EXAMPLE 2

A copper powder for use in a conductive paste was obtained by the same treating method as employed in Example 1, in which 0.1 part of palm mono-amine acetate, 5 parts of a bis-1,2,3-trihydroxypropaneborite.8-heptadecane-1-carboxylate.N-polyoxyethylene-1-aminohexadecane compound, and 5 parts of isopropyl-triisostearoyl-titanate were coated on a copper powder prepared by an electrolytic method and having a mean particle size of 2 μm.

A conductive paste was manufactured by using the thus obtained copper powder and by employing the same method as in Example 1. The thus manufactured conductive paste was printed and a coating film was formed, and tests were conducted with respect to the conductivity of the coating film. The coating film showed good conductive properties, that is an initial conductivity of $1.5 \times 10^{-4}$ Ω.cm, a conductivity after a thermal resistance test of $4 \times 10^{-4}$ Ω.cm, and a conductivity after a humidity resistance test of $5 \times 10^{-4}$ Ω.cm. On the other hand, a copper paste which was manufactured also in this example by using a raw material copper powder without subjecting the same to the surface treatment showed an initial conductivity of $8 \times 10^{-3}$ Ω.cm, but showed a conductivity after a thermal resistance test and a humidity resishance test of above $10^8$ Ω.cm, thus being unsuitable for practical use.

EXAMPLE 3

An aqueous solution in which 10 parts of palm mono-amine acetate had been dissolved in 1000 parts of water was sprayed by used of a sprayer onto 100 parts of a copper powder placed on a filter fiber, which copper powder was prepared by an aqueous solution reduction method and had a mean particle size of 1 μm. Thereafter, the copper powder was dried in a vacuum drier at a temperature of 60° C. for a period of 600 minutes. The thus dried copper powder had an anti-oxidization film which had a hydrophobic property and a small oxidization amount of 0.5 weight percent.

10 parts of a bis-1,2,3-trihydroxypropaneborite.8-heptadecane-1-carboxylate.N-polyoxyethylene-1-aminohexadecane compound, 5 parts of isopropyl-triisostearyl-titanate, and 5 parts of acetoalkoxy-aluminum-diisopropylate were added to 100 parts of the resulting copper powder. The above substances were mixed with a mixer at a speed of 60 rpm for a period of 30 minutes, thus allowing the copper powder to be coated, and thereby obtaining a copper powder for use in a conductive paste.

The thus obtained copper powder was tested with respect to its properties as a material in a conductive paste by using the same methods as those in Example 1. The coating film formed of the copper powder showed very good properties, that is, an initial conductivity of $1.1 \times 10^{-4}$ Ω.cm, a conductivity after a thermal resistance test of $3 \times 10^{-4}$ Ω.cm, and a conductivity after a humidity resistance test of $3 \times 10^{-4}$ Ω.cm. On the other hand, a copper paste manufactured in this example by using a raw material copper powder without subjecting the same to the surface treatment showed a low initial conductivity of $10^{-1}$ Ω.cm, probably because of a large oxidization amount, i.e. 2 weight percent, of the raw material copper powder used, and was thus unsuitable for practical use.

EXAMPLE 4

An aqueous solution in which 0.01 part of palm mono-amine salicylate had been dissolved in 100 parts of water was sprayed by use of a sprayer onto 100 parts of a copper powder placed on a filter fabric, which powder was prepared by an electrolytic method and had a mean particle size of 5 μm. Thereafter, the copper power was dried in a vacuum drier at a temperature of 100° C. for a period of 180 minutes, thereby forming an anti-oxidization film which had a hydrophobic property on the surface of the copper powder.

2 parts of a polyoxyethylene-bis-1,2,3-trihydroxypropaneborite.8-heptadecane-1-carboxylate.N-polyoxyethylene-1-aminohexadecane compound, and 2 parts of isopropyl-triisostearoyl-titanate were added to 100 parts of the resulting copper powder having an anti-oxidization film. The above substances were mixed with a mixer at a speed of 60 rpm for a period of 60 minutes, thus allowing the copper powder to be coated, and thereby obtaining a copper powder for use in a conductive paste.

30 parts of a phenolic resin having a solid content of 60 weight percent was added to 100 parts of the thus obtained copper powder, and the resin and the copper powder were kneaded by use of a ball mill for a period of 60 minutes, thus manufacturing a conductive copper paste. The thus manufactured conductive copper paste was printed on a sheet of a phenolic resin using a screen of 250 mesh so as to form a pattern having a thickness of 20 μm, a line width of 2 mm, and a length of 150 mm, and then followed by thermally curing the paste at a temperature of 160° C. for a period of 30 minutes, thereby manufacturing a coating film. When the conductivity of the thus manufactured coating film was measured by the same methods as those used in Example 1, the coating film showed very good conductive properties, that is, an initial conductivity of $1.0 \times 10^{-4}$ Ω.cm, a conductivity after a thermal resistance test of $1.8 \times 10^{-4}$ Ω.cm, and a conductivity after a humidity resistance test of $2 \times 10^{-4}$ Ω.cm, and the conductivity of the coating film was thus approximate to a conductivity of $0.7\text{-}10^{-4}$ Ω.cm exhibited by a coating film in which a silver powder is used.

On the other hand, a copper paste manufactured in this example by using a raw material copper powder without subjecting the same to the surface treatment showed a low initial conductivity of $10^{-1}$ Ω.cm.

EXAMPLE 5

A copper powder for use in a conductive paste was obtained by using the same raw material copper powder as that used in Example 4, and by employing the same treating methods as those employed in Example 4, in which 0.01 part of palm di-amine adipate, 2 parts of a bis-1,2,3-trihydroxypropaneborite.1-isoheptylisodecane-1-carboxylate.N-polyoxyethylene-1-amino-hexadecane compound, and 2 parts of isopropyl-triisostearoyl-titanate were added to the raw material copper powder.

When the conductivity of the thus obtained copper powder for use in a conductive paste was measured by the same methods as those used in Example 4, the coating film showed an initial conductivity of $0.9 \times 10^{-4}$ Ω.cm, a conductivity after a thermal resistance test of $1.5 \times 10^{-4}$ Ω.cm, and a conductivity after a humidity resistance test of $2.5 \times 10^{-4}$ Ω.cm.

EXAMPLE 6

A copper powder for use in a conductive paste was obtained by using the same raw material copper powder as that used in Example 4, and by employing the same treating methods as those employed in Example 4, in which 0.01 part of palm di-amine adipate, 2 parts of a bis-1,2,3-trihydroxypropaneborite.octadecane-1,2-dicarboxylate-N-polyoxyethylene-1-aminohexadecane compound, and 2 parts of acetoalkoxy-aluminum-diisopropylate were added to the raw material copper powder.

When the conductivity of the thus obtained copper powder for use in a conductive paste was measured by the same methods as those used in Example 4, the coating film showed an initial conductivity of $0.9 \times 10^{-4}$ Ω.cm, a conductivity after a thermal resistance test of $1.2 \times 10^{-4}$ Ω.cm, and a conductivity after a humidity resistance test of $3 \times 10^{-4}$ Ω.cm.

EXAMPLE 7

A copper powder for use in a conductive paste was obtained by using the same raw material copper powder as that used in Example 4, and by employing the same treating methods as those employed in Example 4, in which 0.01 parts of palm mono-amine acetate, 2 parts of a bis-1,2,3-trihydroxypropaneborite.octadecane-1,2-dicarboxylate-2,2',2''-nitrilotriethanol compound, and 2 parts of isopropyl-triisostearoyl-titanate were added to the raw material copper powder.

When the conductivity of the thus obtained copper powder for use in a conductive paste was measured by the same methods as those used in Example 4, the coating film showed an initial conductivity of $1.5 \times 10^{-4}$ Ω.cm, a conductivity after a thermal resistance test of $2 \times 10^{-4}$ Ω.cm, and a conductivity after a humidity resistance test of $2.5 \times 10^{-4}$ Ω.cm.

EXAMPLE 8

A copper powder for use in a conductive paste was obtained by using 100 parts of a raw material copper powder which was prepared by an electrolytic method, pulverized and had a mean particle size of 2 μm, and by employing the same treating methods as those employed in Example 4, in which 1 part of palm mono-amine salicylate, 5 parts of a bis-1,2,3-trihydroxypropane-borite.1-isoheptylisodecane-1-carboxylate.N-polyoxyethylene-1-aminohexadecane compound, and 5 parts of isopropyl-triisostearoyl-titanate were added to the raw material copper powder.

When the conductivity of the thus obtained copper powder for use in a conductive paste was measured by the same methods as those used in Example 4, the coating film showed good conductive properties, i.e. an initial conductivity of $1.0 \times 10^{-4}$ Ω.cm, a conductivity after a thermal resistance test of $2.5 \times 10^{-4}$ Ω., and a conductivity after a humidity resistance test of $3 \times 10^{-4}$ Ω.cm.

EXAMPLE 9

A copper powder for use in a conductive paste was obtained by adding 1 part of a solution in which 0.1 part of beef tallow di-amine salicylate had been dissolved in 0.9 part of toluene, 5 parts of a bis-1,2,3-trihydroxy-propaneborite.1-isoheptylisodecane-1-carboxylate.N-polyoxyethylene-1-aminohexadecane compound, and 5 parts of isopropyl-triisostearoyl-titanate to 100 parts of a copper powder prepared by an electrolytic method, pulverized and having a mean particle size of 2 μm, and by mixing these substances with a mixer at a speed of 60 rpm for a period of 60 minutes, thus allowing the raw material copper powder to be coated.

When the conductivity of the thus obtained copper powder for use in a conductive paste was measured by the same methods as those used in Example 4, the coating film showed an initial conductivity of $5 \times 10^{-4}$ Ω.cm, a conductivity after a thermal resistance test of $6 \times 10^{-4}$ Ω.cm, and a conductivity after a humidity resistance test of $6 \times 10^{-4}$ Ω.cm.

EXAMPLE 10

An aqueous solution in which 0.005 part of palm mono-amine salicylate had been dissolved in 100 parts of water was sprayed by use of a sprayer onto 100 parts of a spherical copper powder placed on a filter fabric and having a mean particle size of 50 μm.

Thereafter, the copper powder was dried at a temperature of 120° C. for a period of 60 minutes, thereby forming an anti-oxidation film which had a hydrophobic property on the surface of the copper powder.

A copper powder for use in a conductive paste was obtained by adding 0.2 part of a polyoxyethylene-bis-1,2,3-trihydroxypropaneborite.8-heptadecane-1-carboxylate.N-polyoxyethylene-1-aminohexadecane compound, and 0.1 part of acetoalkoxy-aluminum-diisopropylate to 100 parts of the resulting copper powder having an anti-oxidation film, and by mixing the above substances with a mixer at a speed of 60 rpm for a period of 30 minutes.

A conductive copper paste was manufactured by mixing 10 parts of an acrylic resin and 30 parts of butyl acetate with 100 parts of the resulting copper powder. The thus manufactured conductive copper paste was coated on a substrate of an acrylic resin with a glass bar so as to form a coating film having a thickness of 100 μm, a line width of 10 mm, and a length of 100 mm. When the conductivity of the thus manufactured coating film was measured by the same methods as those used in Example 1, the coating film showed an initial conductivity of $5 \times 10^{-4}$ Ω.cm, a conductivity after a thermal resistance test of $5.5 \times 10^{-4}$ Ω.cm, and a conductivity after a humidity resistance test of $6 \times 10^{-4}$ Ω.cm.

On the other hand, a copper paste manufactured in this example by using a raw material copper powder showed an initial conductivity of $8 \times 10^{-3}$ Ω.cm, but showed a conductivity above $10^8$ Ω.cm after thermal and humidity resistance tests.

As described above in detail, the copper powder for use in a conductive paste in accordance with the present invention in an epoch-making copper powder which exhibits excellent conductivity, thermal resistance, and humidity resistance when used as a material in a conductive paste. Therefore, the present invention makes it possible to use cheap copper powder not only for those purposes in which nickel powders have conventionally been used, but also for applications with printed circuits or adhesive in which a high level of conductivity and reliability are required and, hence, in which only silver powders have conventionally been applicable.

What is claimed is:

1. A copper powder for use in a conductive paste, which comprises a raw material copper powder; an anti-oxidization film formed on the surface of the copper powder, comprising an organic acid salt of a higher aliphatic amine in an amount of 0.005 to 10 parts by weight relative to 100 parts by weight of the copper powder, the organic acid salt of a higher aliphatic amine being a salt of an aliphatic mono- or di-amine having aliphatic hydrocarbon having 12 to 22 carbon atoms and a mono- or di-carboxylic acid having either aliphatic hydrocarbon having 2 to 23 carbon atoms or aromatic hydrocarbon groups having 7 to 8 carbon atoms; and a surface film which comprises 0.2 to 10 parts by weight of a dispersing agent selected from the group consisting of a combination of a boron-containing surfactant and a nitrogen-containing surfactant wherein the boron-containing surfactant has in the molecule thereof a boronic acid ester bond with polyhydric alcohol and has one or more groups of hydrocarbons having 7 to 25 carbon atoms, and the nitrogen-containing surfactant has one or more groups of hydrocarbons having 7 to 25 carbon atoms, and has non-covalent electron pairs; and 0.1 to 10 parts by weight of at least one coupling agent of the group consisting of isopropyl-triisostearoyl-titanate and acetoalkoxy-aluminum-diisopropylate, relative to 100 parts by weight of the copper powder, and which is formed on the anti-oxidation film.

2. A copper powder as set forth in claim 1 wherein the mean particle size of the copper powder is not more than 50 μm.

3. A copper powder as set forth in claim 1 wherein the ratio of the dispersing agent to the coupling agent is not less than 1:1.

4. A process for preparing a copper powder for use in a conductive paste, which comprises the steps of forming an anti-oxidization film comprising an organic acid salt of a higher aliphatic amine on a surface of a raw material copper powder in an amount of 0.005 to 10 parts by weight relative to 100 parts by weight of copper powder, the organic acid salt of a higher aliphatic amine being a salt of an aliphatic mono- or di-amine having aliphatic hydrocarbon having 12 to 22 carbon atoms and a mono- or di-carboxylic acid having either aliphatic hydrocarbon having 2 to 23 carbon atoms or aromatic hydrocarbon groups having 7 to 8 carbon atoms; and then forming thereon a surface film comprising 0.2 to 10 parts by weight of a dispersing agent selected from the group consisting of a combination of boron-containing surfactant and a nitrogen-containing surfactant wherein the boron-containing surfactant has in the molecule thereof a boronic acid ester bond with polyhydric alcohol and has one or more groups of hydrocarbons having 7 to 25 carbon atoms, and the nitrogen-containing surfactant has one or more groups of hydrocarbons having 7 to 25 carbon atoms, and has non-covalent electron pairs; and 0.1 to 10 parts by weight of at least one coupling agent selected from the group consisting of isopropyl-triisostearoyl-titanate and acetoalkoxy-aluminum-diisopropylate, relative to 100 parts by weight of the copper powder.

5. A copper powder as set forth in claim 1 wherein the dispersing agent is selected from the group consisting of a bis-1,2,3-trihydroxypropaneborite.8-heptadecane-1-carboxylate.N-polyoxy-ethylene-1-aminohexadecane compound; a polyoxyethylene-bis-1,2,3-trihydroxypropaneborite.8-heptadecane-1-carboxylate.N-polyoxyethylene-1-aminohexadecane compound; a bis-1,2,3-trihydroxypropaneborite.1-isoheptylisodecane-1-carboxylate.N-polyoxyethylene-1-aminohexadecane compound; a bis-1,2,3-trihydroxypropaneborite.octadecane-1,2-dicarboxylate.N-poloxy-ethylene-1-aminohexadecane compound; and a bis-1,2,3-trihydroxypropaneborite.octadecane-1,2-dicarboxylate.2,2′,2″-nitrilotriethanol compound.

6. A process as set forth in claim 4 wherein the dispersing agent is selected from the group consisting of a bis-1,2,3-trihydroxypropaneborite.8-heptadecane-1-carboxylate.N-polyoxy-ethylene-1-aminohexadecane compound; a polyoxyethylene-bis-1,2,3-trihydroxypropaneborite.8-heptadecane-1-carboxylate.N-polyoxyethylene-1-aminohexadecane compound; a bis-1,2,3-trihydroxypropaneborite.1-isoheptylisodecane-1-carboxylate.N-polyoxyethylene-1-aminohexadecane compound; a bis-1,2,3-trihydroxypropaneborite.octadecane-1,2-dicarboxylate.N-polyoxyethylene-1-aminohexadecane compound; and a bis-1,2,3-trihydroxypropaneborite.octadecane-1,2-dicarboxylate.2,2′,2″-nitrilotriethanol compound.

* * * * *